United States Patent
Zhang et al.

(10) Patent No.: US 7,635,600 B2
(45) Date of Patent: Dec. 22, 2009

(54) PHOTOVOLTAIC STRUCTURE WITH A CONDUCTIVE NANOWIRE ARRAY ELECTRODE

(75) Inventors: Fengyan Zhang, Vancouver, WA (US); Robert A. Barrowcliff, Vancouver, WA (US); Sheng Teng Hsu, Camas, WA (US)

(73) Assignee: Sharp Laboratories of America, Inc., Camas, WA (US)

(*) Notice: Subject to any disclaimer, the term of this patent is extended or adjusted under 35 U.S.C. 154(b) by 333 days.

(21) Appl. No.: 11/280,423

(22) Filed: Nov. 16, 2005

(65) Prior Publication Data

US 2007/0111368 A1   May 17, 2007

(51) Int. Cl.
    *H01L 21/00* (2006.01)
(52) U.S. Cl. .............. 438/7; 438/427; 438/56; 438/64; 257/E25.009; 257/136; 136/243
(58) Field of Classification Search ........... 438/427, 438/7, 56, 64; 257/E25.009; 136/243
    See application file for complete search history.

(56) References Cited

U.S. PATENT DOCUMENTS

| | | | | |
|---|---|---|---|---|
| 3,038,952 | A * | 6/1962 | Ralph | 438/63 |
| 3,247,477 | A * | 4/1966 | Fridrich | 338/15 |
| 4,155,781 | A | 5/1979 | Diepers | |
| 6,518,494 | B1 | 2/2003 | Shibuya et al. | |
| 6,525,461 | B1 * | 2/2003 | Iwasaki et al. | 313/495 |
| 6,860,982 | B2 | 3/2005 | Okura et al. | |
| 6,946,597 | B2 * | 9/2005 | Sager et al. | 136/263 |
| 6,969,897 | B2 * | 11/2005 | Kim, II | 257/432 |
| 7,116,546 | B2 * | 10/2006 | Chow et al. | 361/508 |
| 7,291,782 | B2 * | 11/2007 | Sager et al. | 136/250 |
| 2002/0063065 | A1 | 5/2002 | Sonoda | |
| 2004/0007956 | A1 * | 1/2004 | Chen | 313/311 |

(Continued)

FOREIGN PATENT DOCUMENTS

DE     10392855     9/2005

(Continued)

OTHER PUBLICATIONS

Rene A.J. Janssen, Jan C. Hummelen, and N. Serdar Sariciftci, "Polymer-fullerene bulk heterojunction solar cell", MRS Bulletin, 30, 33, (2005).

(Continued)

*Primary Examiner*—Sue Purvis
*Assistant Examiner*—Ankush k Singal
(74) *Attorney, Agent, or Firm*—Law Office of Gerald Maliszewski; Gerald Maliszewski

(57) ABSTRACT

A photovoltaic (PV) structure is provided, along with a method for forming a PV structure with a conductive nanowire array electrode. The method comprises: forming a bottom electrode with conductive nanowires; forming a first semiconductor layer of a first dopant type (i.e., n-type) overlying the nanowires; forming a second semiconductor layer of a second dopant type, opposite of the first dopant type (i.e., p-type), overlying the first semiconductor layer; and, forming a top electrode overlying the second semiconductor layer. The first and second semiconductor layers can be a material such as a conductive polymer, a conjugated polymer with a fullerene derivative, and inorganic materials such as CdSe, CdS, Titania, or ZnO. The conductive nanowires can be a material such as $IrO_2$, $In_2O_3$, $SnO_2$, or indium tin oxide (ITO).

18 Claims, 2 Drawing Sheets

U.S. PATENT DOCUMENTS

| | | | |
|---|---|---|---|
| 2004/0109666 A1* | 6/2004 | Kim, II | 385/147 |
| 2005/0067935 A1* | 3/2005 | Lee et al. | 313/309 |
| 2005/0127351 A1* | 6/2005 | Tolt | 257/10 |
| 2005/0224790 A1* | 10/2005 | Jin et al. | 257/43 |
| 2005/0257821 A1* | 11/2005 | Ramanathan et al. | 136/203 |
| 2006/0279905 A1* | 12/2006 | Chow et al. | 361/508 |
| 2007/0089783 A1* | 4/2007 | Jung et al. | 136/263 |

FOREIGN PATENT DOCUMENTS

| | | |
|---|---|---|
| JP | 03151672 | 6/1991 |
| WO | WO 2003/019676 | 3/2003 |
| WO | WO 2004/044948 | 5/2004 |
| WO | WO 2004/053941 | 6/2004 |
| WO | WO 2004/086464 | 10/2004 |

OTHER PUBLICATIONS

Kevin M. Coakley, Yuxiang Liu, Chiatzun Goh, and Michael D. McGehee, "ordered organic-inorganic bulk heterojunction photovoltaic cells", MRS Bulletin, 30, 37 (2005).

* cited by examiner

PHOTOVOLTAIC STRUCTURE WITH A CONDUCTIVE NANOWIRE ARRAY ELECTRODE

BACKGROUND OF THE INVENTION

1. Field of the Invention

This invention generally relates to integrated circuit (IC) and solar cell fabrication and, more particularly, to a photovoltaic device using a conductive nanowire array electrode.

2. Description of the Related Art

A photovoltaic (PV) cell, which is often referred to as a solar cell, is most often a semiconductor device with a large-area p-n junction diode. In the presence of sunlight, the PV is capable of generating electrical energy. This conversion is called the photovoltaic effect. Efficiency is a known problem associated with solar cells. Efficiency is the ratio of the electric power output to the light power input. Solar radiation has an approximate maximum value of 1000 watts per square-meter ($W/m^2$). Solar cell efficiencies vary between 6%, using amorphous silicon materials, and 30% or even higher efficiencies, using experimental materials.

The most common solar cell material is crystalline silicon. Single-crystal cells have an efficiency on the order of 14-20%, and are expensive, because they are cut from cylindrical ingots. Polycrystalline cells are made from cast ingots. While cheaper and more easily formed into desired shapes, these cells are less efficient. Nanocrystalline structures are inefficient, but easier to make. Self supporting wafers, of whatever crystalline structure are soldered together to form a module.

With thin-film approaches, the entire module substrate is coated and etched to differentiate individual cells. Amorphous silicon films are fabricated using chemical vapor deposition (CVD) techniques, typically plasma-enhanced (PECVD). These cells have low efficiencies of around 8%. CIS, which stands for general chalcogenide films of Cu(In-xGa1-x)(SexS1-x)2, is a thin-film that can achieve an 11% efficiency at a relatively high manufacturing cost.

As described above, most solar cells are Si based. Since Si is a group IV atom, each atom has 4 valence electrons in its outer shell. Silicon atoms can covalently bond to other silicon atoms to form a solid. There are two basic types of solid silicon, amorphous and crystalline. As a solid semiconductor, there are certain bands of energies which the Si electrons are allowed to have, and other energies between these bands which are forbidden. These forbidden energies are called the bandgap.

At room temperature, pure silicon is a poor electrical conductor, as Fermi level lies in the bandgap. To improve conductivity, Si is doped with very small amounts of atoms from either group III or group V of the periodic table. These dopant atoms take the place of the silicon atoms in the crystal lattice, and bond with their neighbouring Si atoms in almost the same way as other Si atoms do. However, because group III atoms have only 3 valence electrons, and group V atoms have 5 valence electrons, there is either one too few, or one too many electrons to satisfy the four covalent bonds around each atom. Since these extra electrons, or lack of electrons (known as "holes") are not involved in the covalent bonds of the crystal lattice, they are free to move around within the solid. If silicon is doped with group III atoms, such as aluminum or gallium, it becomes a p-type silicon because the majority charge carriers (holes) carry a positive charge, while silicon doped with group V atoms, such as phosphorus or arsenic, becomes n-type silicon because the majority charge carriers (electrons) are negative.

The absorption of photons creates electron-hole pairs, which diffuse to the electrical contacts and can be extracted as electrical power. When a photon of light hits a piece of silicon, one of two things can happen. First, the photon can pass straight through the silicon, which is likely if the energy of the photon is lower than the Si bandgap energy. Alternately, the photon is absorbed by the silicon, which is likely if the photon energy is greater than the bandgap energy of silicon. When a photon is absorbed, its energy is given to an electron in the crystal lattice. Usually this electron is in the valence band, and is tightly bound in covalent bonds between neighbouring atoms, and hence unable to move far. The energy given to it by the photon "excites" it into the conduction band, where it is free to move around within the semiconductor. The covalent bond to which the electron was previously bound now has a hole, as a result of losing an electron. Bonded electrons from neighboring atoms can move into this hole, leaving a hole behind them. In this manner, a hole can be said to move through the lattice. Alternately stated, the photons absorbed by the Si create mobile electron-hole pairs.

A typical solar cell includes a layer of n-type Si adjacent a layer of p-type Si. As explained above, electrons diffuse from the region of high electron concentration, which is the n-type side of the junction, into the region of low electron concentration, which is the p-type side of the junction. When the electrons diffuse across the p-n junction, they recombine with holes on the p-type side. As electrons from donor atoms on the n-type side of the junction cross into the p-type side, positively charged group V donor atoms nuclei make the n-type side of the junction positively charged. Simultaneously, as electrons fill the holes on the p-type side of the junction, the group III acceptor atoms create an excess of negative charge on the p-type side of the junction. This imbalance of charge across the p-n junction sets up an electric field which opposes further diffusion of charge carriers across the junction.

This region in which the electrons have diffused is called the depletion region or space charge region, as there are no mobile charge carriers. The electric field which is set up across the p-n junction creates a diode, which passes current in a single direction. That is, electrons flow from the n-type side into the p-type side, and holes flow from the p-type side to the n-type side.

However, if a photon-generated electron-hole pair is created within a minority carrier diffusion length of the junction, then current will flow across the junction. That is, the electric field at the junction will either sweep an electron to the n-type side, or a hole to the p-type side.

The invention of conductive polymers may lead to the development of much cheaper cells that are based on inexpensive plastics, rather than semiconductor silicon. However, organic solar cells suffer from degradation upon exposure to UV light and have limited lifetimes.

Cadmium telluride (CdTe) and copper indium gallium selenide (CIGS) can be used to make efficient solar cells. Unlike a p-n junction Si cell, these cells are best described by a more complex heterojunction model.

Polymer or organic solar cells are built from ultra thin layers organic semiconductors such as polyphenylene vinylene and fullerene. The p/n junction model only partially describes the cell operation. Other functions, such as electron hopping, also contribute to the cell operation. While these cells are cheaper to make than Si or inorganic cells, their efficiencies are low and sensitivity to the environment is high. However, the technology has already been applied commercially to organic LEDs and organic (polymer) displays.

FIG. 1 is a partial cross-sectional view of a bulk heterostructure with phase separation (prior art). In order to improve efficiency, a third generation organic photovoltaic (OPV) structure has been proposed using a bulk heterojunction—by casting solutions containing a blend of two organic films that are coated onto a substrate, as shown in FIG. 1. The problem with this kind of structure is the disordered nanostructures, in that the two phases created are separated by too large of a length scale. Consequently, some of the generated excitons are not able to diffuse to an interface to be dissociated before they decay. In other cases, the phases have "dead ends" that prevent charge carriers from reaching an electrode.

FIG. 2 is a partial cross-sectional view of an ordered bulk heterojunction solar cell using flat bottom and top electrodes, and a conjugated polymer to fill the pores (prior art). To address the phase separation problem, an ordered heterojunction has been proposed. One of the most attractive approaches is to use a block copolymer that self assembles to form an array of cylinders, oriented perpendicular to the substrate. Unfortunately this structure is very hard to make and is not commercially feasible.

Another approach is to use an organic-inorganic composite that combines conjugated polymer with a nanostructured, large bandgap inorganic semiconductor such as TiO2, CdS, or ZnO. The nanostructured inorganic semiconductor can be a nanowire or nanorod array grown on a flat conductive electrode. The conjugated polymer fills the pores. A flat transparent conductive top electrode is then deposited. Catalysts or seed layers are usually deposited on the bottom electrode to enhance the semiconductor array formation. Sometimes the formation temperature of the semiconductor array is high, preventing the use of the process with cheap glass or plastic substrates. Thus, it is difficult to grow a semiconductor nanowire or nanorod array overlying a flat-surface electrode.

It would be advantageous if a conductive nanorod array could be coated with semiconductor material using a thin-film process, instead of growing semiconductor nanowires from an electrode.

SUMMARY OF THE INVENTION

This invention provides a PV (photovoltaic) structure using a conductive nanowires (nanorods) array such as IrO2 or ITO nanowires connected to a bottom electrode. The nanowires or nanorods are covered with two semiconductor layers. The bottom electrode nanowires array can be formed at a low temperature, in the case of IrO2 nanowires. Then, the deposition of the subsequent semiconductor layers can be any conventional process such as CVD, PVD, ALD, spin on, or electrochemical process, instead of a complicated nanostructures process. The method is relatively easy to control, as long as the conductive nanowire array electrode can be made early in the process.

Accordingly, a method is provided for forming a photovoltaic structure with a conductive nanowire array electrode. The method comprises: forming a bottom electrode with conductive nanowires; forming a first semiconductor layer of a first dopant type (i.e., n-type) overlying the nanowires; forming a second semiconductor layer of a second dopant type, opposite of the first dopant type (i.e., p-type), overlying the first semiconductor layer; and, forming a top electrode overlying the second semiconductor layer.

The first and second semiconductor layers can be a material such as a conductive polymer, a conjugated polymer with a fullerene derivative, or inorganic materials such as CdSe, CdS, Titania, or ZnO. The conductive nanowires can be a material such as $IrO_2$, $In_2O_3$, $SnO_2$, or indium tin oxide (ITO). One electrode, either the top or the bottom, is typically a material such as Pt, Al, or Ir. Then, the other electrode is a transparent material such as ITO, $IrO_2$, $In_2O_3$, or $SnO_2$.

Additional details of the above-described method and a photovoltaic structure with a conductive nanowire array electrode are provided below.

DETAILED DESCRIPTION

Figure 1:
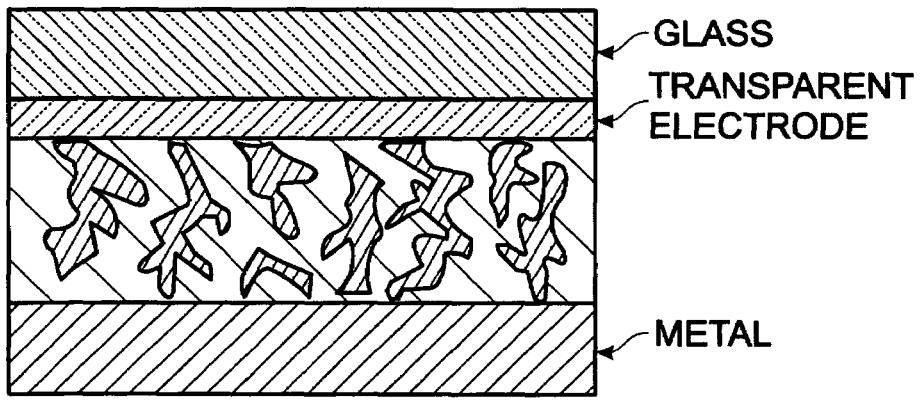
FIG. 1 is a partial cross-sectional view of a bulk heterostructure with phase separation (prior art).
Figure 2:
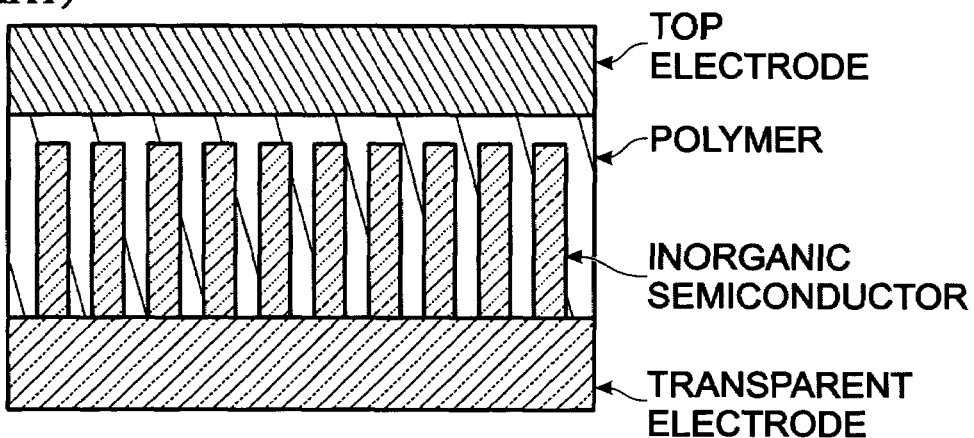
FIG. 2 is a partial cross-sectional view of an ordered bulk heterojunction solar cell using flat bottom and top electrodes, and a conjugated polymer to fill the pores (prior art).
Figure 3A:
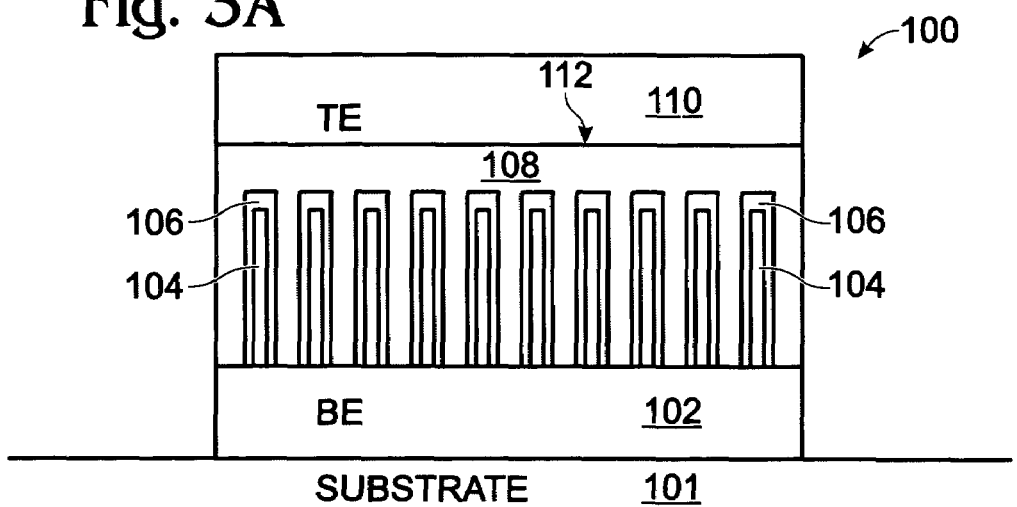
FIGS. 3A and 3B are partial cross-sectional views of a photovoltaic (PV) structure with a conductive nanowire array electrode.
Figure 3B:
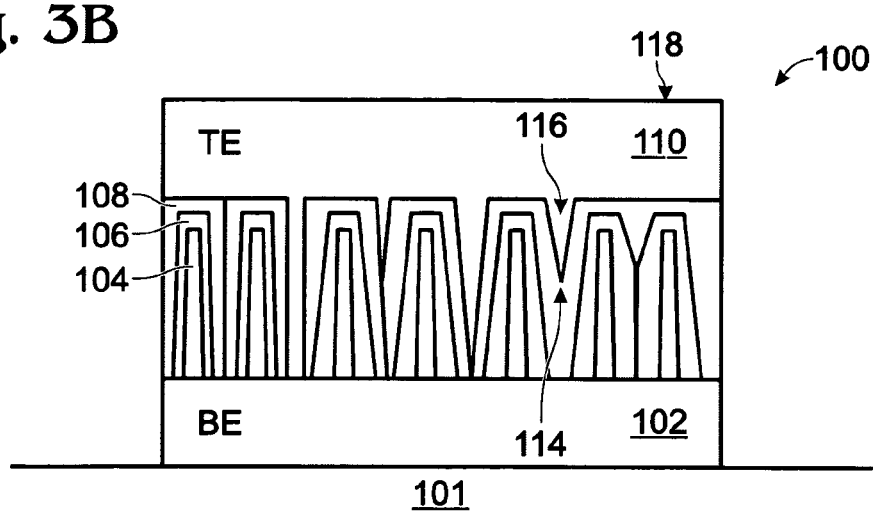

FIGS. 3A and 3B are partial cross-sectional views of a photovoltaic (PV) structure with a conductive nanowire array electrode. The PV structure 100 comprises a bottom electrode (BE) 102 with conductive nanowires 104. In some aspects, the bottom electrode is formed on a substrate such as a semiconductor material, glass, ceramic, metal, quartz, or plastic. The nanowires 104 are typically a material such as $IrO_2$, $In_2O_3$, $SnO_2$, carbon nanotube (CNT), or ITO. However, other conductive materials may also be used. The nanowire may alternately be called a nanorod, nanotube, or nanofiber. The nanowire is not limited to any particular diameter, length, or density. The nanowire may be single or multi-walled. A first semiconductor layer 106 of a first dopant type overlies the nanowires 104. A second semiconductor layer 108 of a second dopant type, opposite of the first dopant type, overlies the first semiconductor layer 106. A top electrode (TE) 110 overlies the second semiconductor layer 108.

For example, if the first semiconductor layer 106 includes an n-type dopant, then the second semiconductor layer 108 includes a p-type dopant. Likewise, if the first semiconductor layer 106 includes a p-type dopant, then the second semiconductor layer 108 includes an n-type dopant.

The first semiconductor layer 106 can be a material such as a conductive polymer, a conjugated polymer with a fullerene derivative, or inorganic materials such as CdSe, CdS, Titania, or ZnO. Likewise, the second semiconductor layer 108 can be a conductive polymer, a conjugated polymer with a fullerene derivative, or inorganic materials like CdSe, CdS, Titania, or ZnO. Thus, the first and second semiconductor layers are made from the same group of materials. As mentioned above, the difference between layers 106 and 108 is in the doping.

In one aspect, the bottom electrode 102 is non-transparent and the top electrode 110 is transparent. For example, the bottom electrode 102 is a material such as Pt, Al, or Ir. The top electrode 110 is then a transparent material such as indium tin oxide (ITO), $IrO_2$, $In_2O_3$, or $SnO_2$. This is not intended to be an exhaustive list of all possible transparent or non-transparent materials, as other materials would be known to those skilled in the art. In another aspect, the bottom electrode 102 is a transparent material such as ITO, $IrO_2$, $In_2O_3$, or $SnO_2$, and the top electrode is a material such as Pt, Al, or Ir.

The difference between FIGS. 3A and 3B is primarily in the structure of the second semiconductor layer 108. In FIG. 3A, the first semiconductor layer 106 conformally coats the nanowires, and the second semiconductor layer 108 fills the interface with the first semiconductor layer 106, to form a flat surface interface 112 with the top electrode 110. In FIG. 3B, the second semiconductor layer 108 more conformally coats the first semiconductor layer 106. However, in FIG., 3B there is no flat surface interface with the top electrode 110. That is, the second semiconductor material baa an irregular (non-flat) top surface 114, and the top electrode 110 has an irregular bottom surface 116 to interface with the second semiconductor top surface 114, as well as a flat top surface 118.

Functional Description

Figure 4:
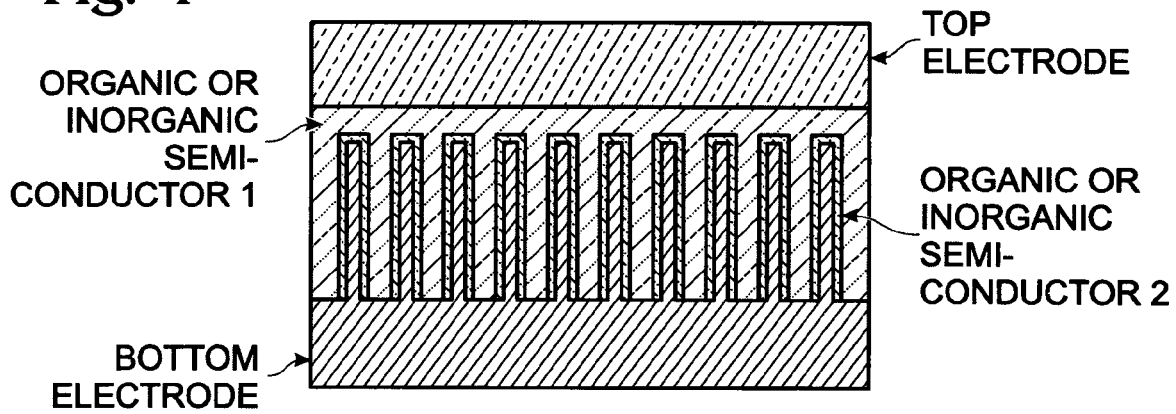
FIG. 4 is another view illustrating the PV structure of FIG. 3A.

FIG. 4 is another view illustrating the PV structure of FIG. 3A. A conductive nanowire array is formed directly to the bottom electrode and then coated with two semiconductor materials (e.g. a conjugated polymer and fullerene derivative, another polymer, or an inorganic semiconductor layer such as CdSe, CdS, Titania, or ZnO. The two layers of semiconductor organic or inorganic materials can be coated in either sequence depending on the deposition technique and efficiency generated. One way is to coat the first layer using a technique with good step coverage such as chemical vapor deposition (CVD), atomic layer deposition (ALD), or an electrochemical process to coat the entire length of wire. Then, the second layer is spun-on or a screen printing technology is used to obtain a flat surface. Subsequently, the top electrode is deposited on this flat surface. A second method coats both layers using a good step coverage method to cover the whole wires. Then, the top electrode can be spin coated to obtain a flat surface (see FIG. 3B).

Figure 5:
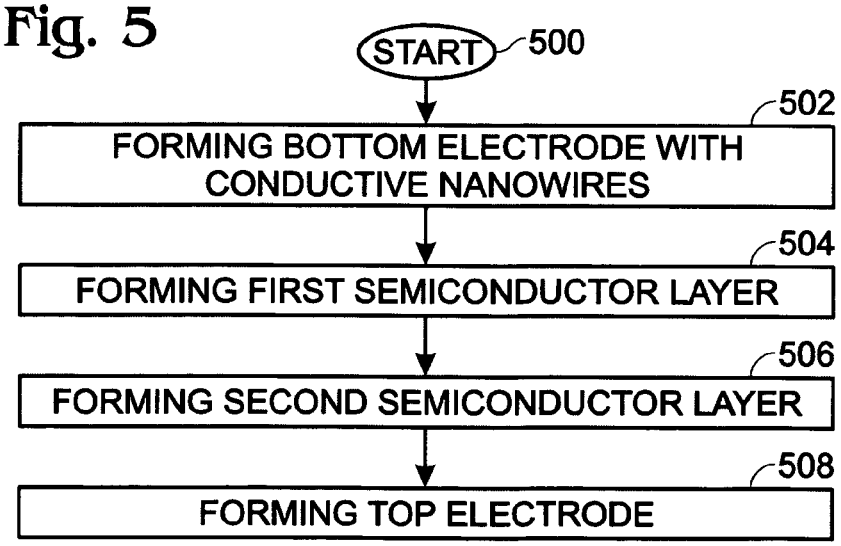
FIG. 5 is a flowchart illustrating a method for forming a PV structure with a conductive nanowire array electrode.

FIG. 5 is a flowchart illustrating a method for forming a PV structure with a conductive nanowire array electrode. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 500.

Step 502 forms a bottom electrode with conductive nanowires. Step 504 forms a first semiconductor layer of a first dopant type overlying the nanowires. Step 506 forms a second semiconductor layer of a second dopant type, opposite of the first dopant type, overlying the first semiconductor layer. Step 508 forms a top electrode overlying the second semiconductor layer.

Forming the first semiconductor layer in Step 504 may include depositing a material such as a conductive polymer, a conjugated polymer with a fullerene derivative, or inorganic materials such as CdSe, CdS, Titania, or ZnO. Likewise, a material from the same group of above-mentioned materials can be deposited in Step 506 to form the second semiconductor layer.

In one aspect, forming the bottom electrode with conductive nanowires in Step 502 includes forming the nanowires from a material such as $IrO_2$, $In_2O_3$, $SnO_2$, carbon (CNT), or ITO. In another aspect, the bottom electrode is a material such as Pt, Al, or Ir, and forming the top electrode in Step 508 includes forming a transparent top electrode from a material such as ITO, $IrO_2$, $In_2O_3$, or $SnO_2$. Alternately, Step 502 may form a transparent bottom electrode from ITO, $IrO_2$, $In_2O_3$, or $SnO_2$, and Step 510 form a top electrode from Pt, Al, or Ir.

In one aspect, forming the first semiconductor layer overlying the nanowires in Step 504 includes forming the first semiconductor layer using a deposition process such as chemical vapor deposition (CVD), physical vapor deposition (PVD), atomic layer deposition (ALD), spin-on deposition, screen printing, or electrochemical deposition. The second semiconductor layer can be formed in Step 506 using the same above-mentioned deposition techniques.

In one aspect, forming the first semiconductor layer in Step 504 includes using a technique that provides good step coverage, coating the nanowires with the first semiconductor material using a CVD, ALD, or electrochemical deposition. Then, forming the second semiconductor layer overlying the first semiconductor layer in Step 506 includes depositing the second semiconductor layer using a deposition process such as spin-on deposition or screen printing, and as a result, forming a second semiconductor flat top surface to interface with a top electrode bottom surface.

In a different aspect, Steps 504 and 506 are both performed using one of the CVD, ALD, or electrochemical deposition processes, to achieve good step coverage. Then, Step 508 forms the top electrode by depositing the top electrode using either a spin-on deposition or screen printing, and as a result, forming a top electrode flat top surface.

A photovoltaic (PV) structure has been provided made with a conductive nanowire array, coated with a p-n junction formed by semiconductor materials deposited overlying the nanowires. A fabrication process for this PV structure has also been provided. Process details and some example materials have been listed to explain the invention. However, the invention is not limited to merely these examples. Other variations and embodiments of the invention will occur to those skilled in the art.

We claim:

1. A method for forming a photovoltaic (PV) structure with a conductive nanowire array electrode, the method comprising:

forming a bottom electrode with conductive nanowires;

forming a first semiconductor layer of a first dopant type overlying the nanowires;

forming a second semiconductor layer of a second dopant type, opposite of the first dopant type, overlying the first semiconductor layer; and, forming a top electrode overlying the second semiconductor layer.

2. The method of claim 1 wherein forming the first semiconductor layer overlying the nanowires includes depositing a material selected from the group consisting of a conductive polymer, a conjugated polymer with a fullerene derivative, and inorganic materials selected from the group consisting of CdSe, CdS, Titania, and ZnO; and, wherein forming the second semiconductor layer overlying the first semiconductor layer includes depositing a material selected from the group consisting of a conductive polymer, a conjugated polymer with a fullerene derivative, and inorganic materials selected from the group consisting of CdSe, CdS, Titania, and ZnO.

3. The method of claim 1 wherein forming the bottom electrode with conductive nanowires includes forming the nanowires from a material selected from the group consisting of $IrO_2$, $In_2O_3$, $SnO_2$, carbon nanotube (CNT), and indium tin oxide (ITO).

4. The method of claim 1 wherein forming the bottom electrode with conductive nanowires includes forming a bottom electrode from a material selected from the group including Pt, Al, and Ir; and, wherein forming the top electrode includes forming a transparent top electrode from a material selected from the group consisting of ITO, $IrO_2$, $In_2O_3$, and $SnO_2$.

5. The method of claim 1 wherein forming the bottom electrode with conductive nanowires includes forming a transparent bottom electrode from a material selected from the group including ITO, $IrO_2$, $In_2O_3$, and $SnO_2$; and, wherein forming the top electrode includes forming a top electrode from a material selected from the group consisting of Pt, Al, and Ir.

6. The method of claim 1 wherein forming the first semiconductor layer overlying the nanowires includes forming the first semiconductor layer using a deposition process selected from the group consisting of chemical vapor deposition (CVD), physical vapor deposition (PVD), atomic layer deposition (ALD), spin-on deposition, screen printing, and electrochemical deposition; and, wherein forming the second semiconductor layer overlying the first semiconductor layer includes forming the second semiconductor layer using a deposition process selected from the group consisting of CVD, PVD, ALD, spin-on deposition, screen printing, and electrochemical deposition.

7. The method of claim 1 wherein forming the first semiconductor layer overlying the nanowires includes coating the nanowires with the first semiconductor material using a deposition process selected from the group consisting of CVD, ALD, and electrochemical deposition; and, wherein forming the second semiconductor layer overlying the first semiconductor layer includes:
depositing the second semiconductor layer using a deposition process selected from the group consisting of spin-on deposition and screen printing; and,
forming a second semiconductor flat top surface to interface with a top electrode bottom surface.

8. The method of claim 1 wherein forming the first semiconductor layer overlying the nanowires includes coating the nanowires with the first semiconductor material using a deposition process selected from the group consisting of CVD, ALD, and electrochemical deposition;

wherein forming the second semiconductor layer overlying the first semiconductor layer includes coating the first semiconductor-coated nanowires with the second semiconductor material using a deposition process selected from the group consisting of CVD, ALD, and electrochemical deposition; and, wherein forming the top electrode includes:
depositing the top electrode using process selected from the group consisting of spin-on deposition and screen printing; and,
forming a top electrode flat top surface.

9. A photovoltaic (PV) structure with a conductive nanowire array electrode, the PV structure comprising:
a bottom electrode with conductive nanowires;
a first semiconductor layer of a first dopant type overlying the nanowires;
a second semiconductor layer of a second dopant type, opposite of the first dopant type, overlying the first semiconductor layer; and,
a top electrode overlying the second semiconductor layer.

10. The PV structure of claim 9 wherein the first semiconductor layer is a material selected from the group consisting of a conductive polymer, a conjugated polymer with a fullerene derivative, and inorganic materials selected from the group consisting of CdSe, CdS, Titania, and ZnO; and, wherein the second semiconductor layer is a material selected from the group consisting of a conductive polymer, a conjugated polymer with a fullerene derivative, and inorganic materials selected from the group consisting of CdSe, CdS, Titania, and ZnO.

11. The PV structure of claim 9 wherein the nanowires are a material selected from the group consisting of $IrO_2$, $In_2O_3$, $SnO_2$, carbon nanotube (CNT), and indium tin oxide (ITO).

12. The PV structure of claim 9 wherein the bottom electrode is a material selected from the group including Pt, Al, and Ir; and, wherein the top electrode is a material selected from the group consisting of ITO, $IrO_2$, $In_2O_3$, and $SnO_2$.

13. The PV structure of claim 9 wherein the bottom electrode is a material selected from the group including ITO, $IrO_2$, $In_2O_3$, and $SnO_2$; and, wherein the top electrode is a material selected from the group consisting of Pt, Al, and Ir.

14. The PV structure of claim 9 wherein the first semiconductor layer is doped with an n-type dopant; and, wherein the second semiconductor layer is doped with a p-type dopant.

15. The PV structure of claim 9 wherein the first semiconductor layer is doped with an p-type dopant; and, wherein the second semiconductor layer is doped with a n-type dopant.

16. The PV structure of claim 9 wherein the first semiconductor layer conformally coats the nanowires.

17. The PV structure of claim 16 wherein the second semiconductor layer conformally coats the first semiconductor layer.

18. The PV structure of claim 17 wherein the second semiconductor layer has an irregular top surface; and, wherein the top electrode has an irregular bottom surface to interface with the second semiconductor layer top surface, and a flat top surface.

* * * * *